United States Patent
Huang et al.

(10) Patent No.: US 7,531,846 B2
(45) Date of Patent: May 12, 2009

(54) LED CHIP PACKAGING STRUCTURE

(75) Inventors: Chih-Fang Huang, Dasi Township, Taoyuan County (TW); Fom-Pu Cha, Gueishan Township, Taoyuan County (TW)

(73) Assignee: Rodman Electronics Co., Ltd., Taoyuan County (TW)

( * ) Notice: Subject to any disclaimer, the term of this patent is extended or adjusted under 35 U.S.C. 154(b) by 0 days.

(21) Appl. No.: 12/076,797

(22) Filed: Mar. 24, 2008

(65) Prior Publication Data

US 2008/0237626 A1 Oct. 2, 2008

(30) Foreign Application Priority Data

Mar. 29, 2007 (TW) .............................. 96205074 U

(51) Int. Cl.
*H01L 33/00* (2006.01)
(52) U.S. Cl. ........................................ 257/99; 257/100
(58) Field of Classification Search .................. 257/81, 257/98–100
See application file for complete search history.

(56) References Cited

U.S. PATENT DOCUMENTS

2006/0157722 A1* 7/2006 Takezawa et al. ............. 257/98

* cited by examiner

*Primary Examiner*—Thien F Tran
(74) *Attorney, Agent, or Firm*—Rosenberg, Klein & Lee

(57) ABSTRACT

An improved LED chip packaging structure includes a substrate, an insulating layer, a light emitting chip and sealing adhesive. At least two conductive traces are disposed on at least one side surface of the substrate. The insulating layer attaches on one side surface of the substrate and includes an insulating film. The light emitting chip is received in the through hole of the insulating layer and attaches on one side surface of the substrate. An adhesive is securing the light emitting chip on the substrate, and the light emitting chip connects with at least one conducting wire. The sealing adhesive is filled into the through hole of the insulating layer. By the direct combination of the light emitting chip and the substrate, the present invention has the advantageous of low cost, the heat dispersal effect is improved, the packaging efficiency is increased, and the market competition is enhanced.

6 Claims, 2 Drawing Sheets

LED CHIP PACKAGING STRUCTURE

BACKGROUND OF THE INVENTION

1. Field of the Invention

The present invention relates to an improved LED chip packaging structure, and more particular to a structure of a light emitting chip directly integrating with a substrate, thus, the present invention has the advantages of low-cost, improved heat dispersing effect, increased packaging efficiency, and enhanced competitiveness.

2. Description of Related Art

Nowadays, because the illuminating power of conventional LED has been increased, LEDs can be used as not only indicating lights or assistant lights, but also illuminating lights. Moreover, the operating current of the present high power LED may be over 2 amperes, and the operating current of conventional LEDs may be only 20 milliamperes, so that the operating current of the present high power LEDs is over 100 times larger than that of conventional LEDs, namely, the illuminating power of single high power LED is higher than a hundred of conventional LEDs. Thus, the luminance of the present high power LEDs is about 160 lumens larger than that of conventional LEDs, enabling convenient usage of power LEDs in many applications. However, the high operating current of the new high power LEDs leads to an inextricable heat dispersing problem.

Please refer to FIG. 1 showing an LED chip packaging structure 1 of a prior art. The structure includes a base 11, a supporting base 12, a chip 13, two conducting wires 14, a lens 15 and a substrate 16. Two electrode ends 111 are set on the base 11. The supporting base 12 is received in the base 11. The supporting base 12 and the base 11 are secured on a side surface of the substrate 16 via heat conducting paste 161, and the top end of the supporting base 12 contains silver adhesive 121, the chip 13 is placed on the surface of the silver adhesive 121. The two conducting wires 14 connect with the surface of chip 13 and electronically connect with the two electrode ends 111 respectively. A layer of phosphor 151 covers the outside of chip 13. The lens 15 is set on the top end of the base 11 to decrease the irradiating angles. The inside of the lens 15 is full of silica gel 152.

However, for the aforementioned LED chip packaging structure 1, the heat produced by the chip 13 cannot be directly dispersed via the substrate 16, but via the supporting base 12, the heat conducting paste 161 and the silver adhesive 121. Thus, the heat dispersing effect is bad. Moreover, the conducting wires 14 of the aforementioned LED chip packaging structure 1 is bonded by a gold wire bond, but gold wire bonds are expensive, so the users are overburdened for the high cost. Further, in the process of manufacturing the LED chip packaging structure 1, the phosphor 151 and the silica gel 152 must be respectively drying, and because the phosphor 151 and the silica gel 152 interfere the dispersion of the LED chip, as a result, the refractive index of a receiving surface of the LED chip is also interfered. Furthermore, the drying processes of the phosphor 151 and the silica gel 152 lead to low efficiency and high cost.

Moreover, there exists a double substrates structure, the chip of which is connected onto the substrates via silver adhesive, and thereby achieving a better heat dispersing effect. However, such structure must be used in the double substrates, which is also high-cost, and the manufacture efficiency cannot be increased. Thus, the market competition of the LED having such double substrates structure is lowered.

Consequently, because of the technical defects of described above, the applicant keeps on carving unflaggingly through wholehearted experience and research to develop the present invention, which can effectively improve the defects described above.

SUMMARY OF THE INVENTION

To overcome the aforementioned shortcomings of the prior arts, the object of the present invention is to provide an improved LED chip packaging structure, the cost of which is lowered, the heat dispersal effect is improved, the packaging efficiency is increased, and the market competition is enhanced.

For achieving the object described above, the present invention provides an improved LED chip packaging structure, the structure including:

A substrate with at least two conductive traces on at least one side;

An insulating layer attaches on one side surface of the substrate and includes an insulating film, an agglutinating layer is adhered between the insulating film and the substrate, and at least one through hole passing through the insulating film and the agglutinating layer;

A light emitting chip is received in the through hole of the insulating layer and attaches on one side surface of the substrate, adhesive is securing the light emitting chip on the substrate, the light emitting chip connects with at least one conducting wire, the conducting wire electronically connects to the conductive traces; and Sealing adhesive is filled into the through hole of the insulating layer.

By the aforementioned technology, the present invention can overcome the shortcomings of the prior arts and has the advantageous of low cost, the heat dispersal effect is improved, the packaging efficiency is increased, and the market competition is enhanced.

DETAILED DESCRIPTION OF THE PREFERRED EMBODIMENTS

The invention, in accordance with preferred and exemplary embodiments, together with further technology, means and advantages thereof, is more particularly comprehended in the following detailed description.

Figure 1:
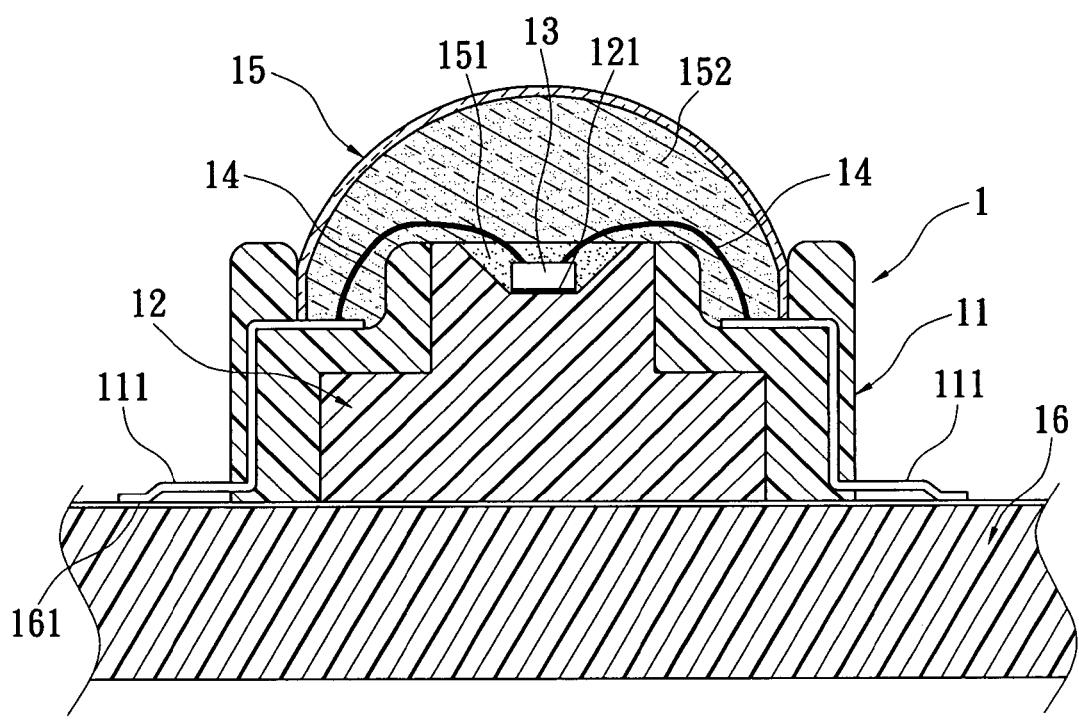
FIG. 1 is a cross section view showing a prior art.
Figure 2:
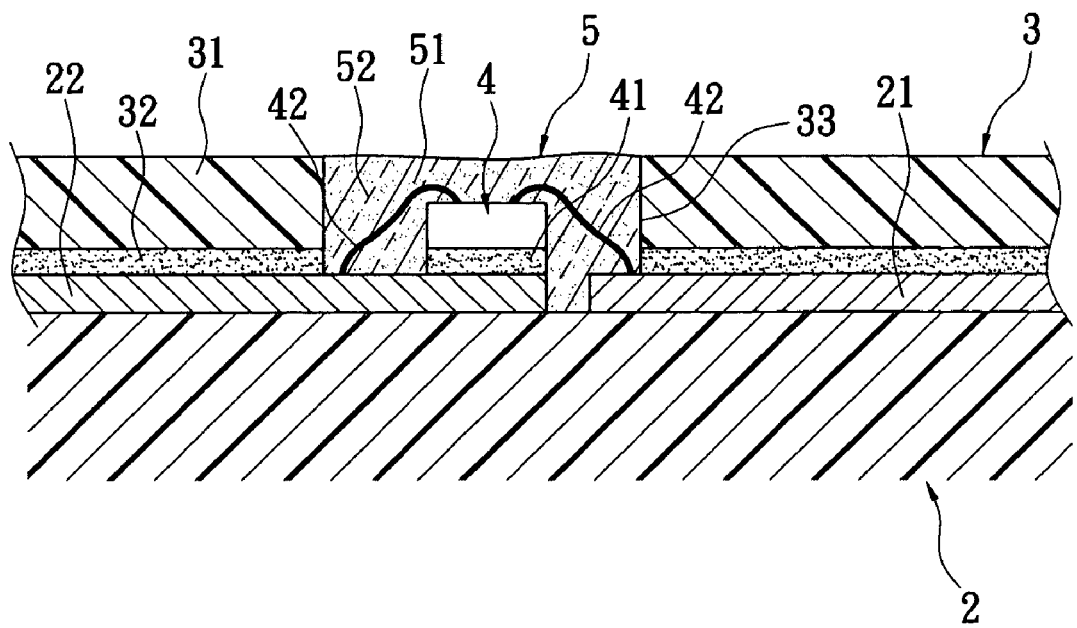
FIG. 2 is a cross section view showing the present invention.

Please refer to FIG. 2 illustrating an improved LED chip packaging structure of the present invention. The structure includes a substrate 2, an insulating layer 3, a light emitting chip 4, and sealing adhesive 5.

At least two conductive traces 21, 22 are disposed on at least one side surface of the substrate 2. The conductive traces 21, 22 are respectively an anode and a cathode of an electrical source. Further, the material of the substrate 2 is copper alloy, aluminum alloy, ceramics, or their combination.

The insulating layer 3 attaches on one side surface of the substrate 2 fitted with the conductive traces 21, 22. The insulating layer 3 includes an insulating film 31, an agglutinating layer 32 is adhered between the insulating film 31 and the substrate 2, and at least one through hole 33 passing through the insulating film 31 and the agglutinating layer 32. Therein, the material of the insulating film 31 may consist of insulating and fireproofing materials such as FR1, FR60, FR65, FR63, FR83 or FR700. The material of the agglutinating layer 32 may be heat-resistant silica gel.

The light emitting chip 4 is received in the through hole 33 of the insulating layer 3 and attaches on one side surface of the substrate 2 fitted with the conductive traces 21, 22. Adhesive 41 is securing the light emitting chip 4 on the substrate 2. The adhesive 41 may be tin paste or silver adhesive. The heat conduction efficiency of the silver adhesive is higher than the tin paste, so it depends on the demand of users to use which one. The light emitting chip 4 is connected on the substrate 2 via the adhesive 41. The light emitting chip 4 connects with at least one conducting wire 42. The conducting wire 42 electronically connects to the conductive traces 21, 22.

The sealing adhesive 5 is filled into the through hole 33 of the insulating layer 3 and is formed via the well-proportioned mixture of phosphor 51 and transparent adhesive 52 to convert the light produced by the light emitting chip 4 into light which has a specified wavelength.

Figure 3:
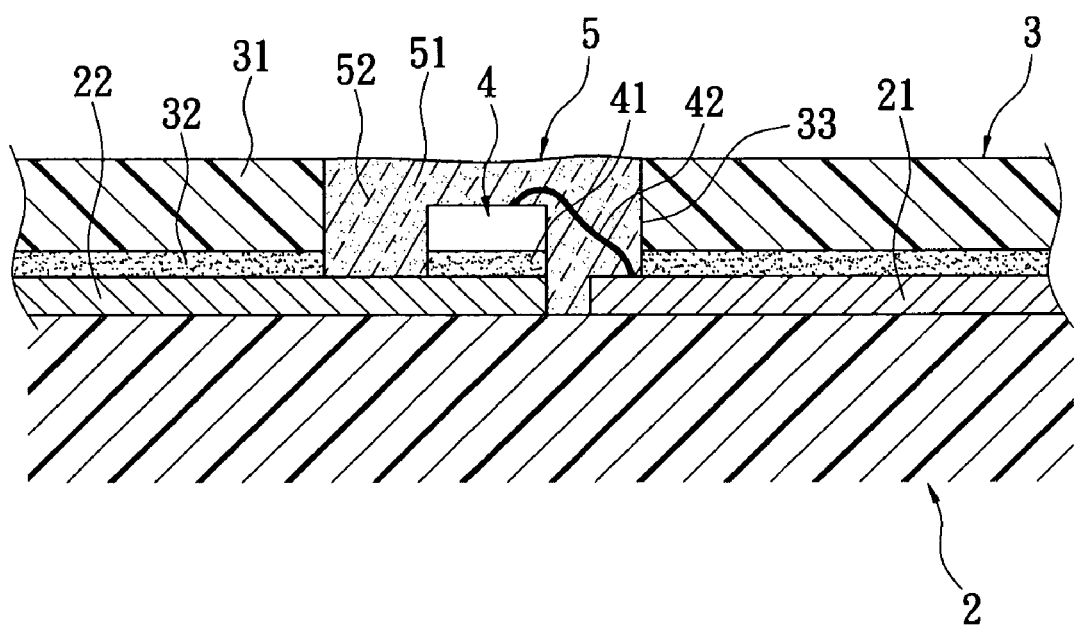
FIG. 3 is another cross section view showing the present invention.

Which is worthwhile to mention is that the light emitting chip 4 includes an anode and a cathode, and the anode and the cathode may be set on a same side of the light emitting chip 4 or on opposite sides thereof. When the anode and the cathode are placed on a same side, the conducting wires 42 are respectively connected with the conductive traces 21, 22 (shown as FIG. 2). Whereas, when the anode and the cathode are set on opposite sides, an electrode face of the light emitting chip 4 attaches on the surface of the conductive traces 21, and the electrode face connects with the conductive traces 21 via the adhesive 41, and another electrode face connects with another conductive trace 22 (shown as FIG. 3).

Compared to the prior arts, the improved LED chip packaging structure of the present invention has the advantageous:

(1) Because the lead frame is needless, the cost is more lower and the market competition is more powerful than the prior arts.

(2) The present invention can function with the bonding angles of gold wire bonds or aluminum wire bonds, so that gold wire bonds or aluminum wire bonds may be selected according to the workshop. Thus, the application scope of the present invention is widened and not limited to the golden wire bond or the aluminum wire bond.

(3) The luminous energy produced by the light emitting chip is directly dispersed via the substrate. Thus, the heat dispersal effect is better than the prior arts, and the damage rate of the light emitting chip is reduced.

(4) Because the lead frame is needless, so the packaging efficiency is increased.

(5) A plurality of light emitting chips can be directly mounted on a same substrate in the present invention, but in the prior arts, the light emitting chips are singly packaged, and then respectively mounted on a same substrate. Thus, the process of the present invention is simply, and the packaging efficiency is increased.

(6) The substrate of the present invention is a panel, so the tin paste can be applied thereon via the stencil printing, but in the prior art, tin paste is applied via manual injection. Thus, the present invention can increase the packaging efficiency and reduce labor costs.

(7) The sealing adhesive of the present invention can be poured at once, but in the prior arts, the phosphor and the silica gel must be poured and respectively dried. Thus, the present invention can decrease the adhering and drying times. Thus, the present invention can increase the efficiency and reduce labor costs.

(8) The sealing adhesive of the present invention can be poured at once, so the light dispersed from the light emitting chips can be directly emitted from the sealing adhesive, but in the prior art, the light dispersed from the light emitting chips must be emitted through a layer of phosphor and a layer of silica gel. Thus, the present invention can achieve a good light dispersing effect.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. 1. An improved LED chip packaging structure, the structure comprising:
   a substrate, at least two conductive traces disposed on at least one side surface of said substrate;
   an insulating layer, attached on one side surface of said substrate and comprising an insulating film, an agglutinating layer adhered between said insulating film and said substrate, and at least one through hole passing through said insulating film and said agglutinating layer;
   a light emitting chip received in said through hole of said insulating layer and attached on one side surface of said substrate, adhesive securing said light emitting chip on said substrate, said light emitting chip connecting with at least one conducting wire, said conducting wire electronically connecting to the conductive traces; and
   sealing adhesive filled into said through hole of said insulating layer.

2. The improved LED chip packaging structure according to claim 1, wherein the material of said substrate is copper alloy, aluminum alloy, ceramics, or their combination.

3. The improved LED chip packaging structure according to claim 1, wherein the material of said insulating film is FR1, FR60, FR65, FR63, FR83 or FR700.

4. The improved LED chip packaging structure according to claim 1, wherein said agglutinating layer is silica gel.

5. The improved LED chip packaging structure according to claim 1, wherein said adhesive is tin paste.

6. The improved LED chip packaging structure according to claim 1, wherein said adhesive is silver adhesive.

* * * * *